(12) United States Patent
Minagawa

(10) Patent No.: US 10,910,823 B2
(45) Date of Patent: Feb. 2, 2021

(54) SEMICONDUCTOR DEVICE DRIVING DEVICE

(71) Applicant: Fuji Electric Co., Ltd., Kanagawa (JP)

(72) Inventor: Kei Minagawa, Nagano (JP)

(73) Assignee: FUJI ELECTRIC CO., LTD., Kanagawa (JP)

(*) Notice: Subject to any disclaimer, the term of this patent is extended or adjusted under 35 U.S.C. 154(b) by 407 days.

(21) Appl. No.: 15/913,626

(22) Filed: Mar. 6, 2018

(65) Prior Publication Data

US 2018/0316182 A1   Nov. 1, 2018

(30) Foreign Application Priority Data

Apr. 27, 2017   (JP) ................................. 2017-089012

(51) Int. Cl.
*H02H 7/122* (2006.01)
*H03K 17/082* (2006.01)

(52) U.S. Cl.
CPC ....... *H02H 7/1227* (2013.01); *H03K 17/0828* (2013.01)

(58) Field of Classification Search
CPC .................. H02H 7/1227; H03K 17/0828
See application file for complete search history.

(56) References Cited

U.S. PATENT DOCUMENTS

| 5,375,029 A * | 12/1994 | Fukunaga | G05F 1/573 323/285 |
| 5,729,032 A | 3/1998 | Tomomatsu et al. | |
| 6,717,785 B2 * | 4/2004 | Fukuda | H03K 17/0828 361/86 |
| 8,466,734 B2 | 6/2013 | Mori | |

FOREIGN PATENT DOCUMENTS

| JP | H7-240516 A | 9/1995 |
| JP | 2008-118767 A | 5/2008 |
| JP | 2012-23899 A | 2/2012 |

* cited by examiner

*Primary Examiner* — Scott Bauer
(74) *Attorney, Agent, or Firm* — Chen Yoshimura LLP

(57) ABSTRACT

A semiconductor device protection circuit for a semiconductor device driving circuit that switches a voltage-controlled semiconductor device ON and OFF includes a current detection circuit that detects current flowing through the semiconductor device and generates and outputs a current detection voltage representing the detected current; an overcurrent detection circuit that compares the current detection voltage to a variable overcurrent detection threshold voltage so as to detect for overcurrent flowing through the semiconductor device; a protection circuit that, when the overcurrent detection circuit detects overcurrent, controls the ON/OFF switching of the semiconductor device so as to prevent thermal breakdown of the semiconductor device; and a gate voltage detection circuit that, in accordance with a gate voltage of the semiconductor device, selectively sets the overcurrent detection threshold voltage to either a first threshold voltage or a second threshold voltage that is lower than the first threshold voltage.

6 Claims, 10 Drawing Sheets

SEMICONDUCTOR DEVICE DRIVING DEVICE

BACKGROUND OF THE INVENTION

Technical Field

The present invention relates to a semiconductor device driving device which switches ON and OFF a voltage-controlled semiconductor device such as an IGBT forming a power converter such as an inverter and which makes it possible to reduce overcurrent when the semiconductor device short-circuits.

Background Art

Power converters such as inverters include, as the primary components thereof, voltage-controlled semiconductor devices such as power MOSFETs or IGBTs, for example. Driving devices for switching these types of semiconductor devices ON and OFF are almost always configured as control ICs including, for example, an IGBT driver circuit and a protection circuit for protecting the IGBT from overheating due to overvoltage/overcurrent or short-circuits.

FIG. 9 schematically illustrates the configuration of the primary components of a driving device 1 having an overcurrent detection feature implemented in the form of a protection circuit, where the reference character 2 is an IGBT which is a voltage-controlled semiconductor device. This IGBT 2 includes a current detection terminal which outputs a sense current is proportional to a current Ic flowing between the collector and the emitter. Moreover, the reference character 3 in the figure is a freewheeling diode connected in anti-parallel between the collector and emitter of the IGBT 2.

The IGBT 2 is switched ON and OFF due to receiving, at the gate thereof, a pulse-shaped drive signal applied from a driver circuit 4. The driver circuit 4 includes a p-type MOSFET 5 and an n-type MOSFET 6, which are cascade-connected and are switched ON and OFF in a complementary manner due to receiving a PWM-modulated pulse signal, for example. The driver circuit 4 is configured so as to output, from the series connection node between the p-type MOSFET 5 and the n-type MOSFET 6, a drive signal which takes either of two values: a supply voltage Vcc or a ground voltage (0V).

The overcurrent detection feature, which is one type of protection circuit installed in the driving device 1 configured as described above, includes a current detection circuit 7 constituted by a resistor Rs which converts the sense current is output from the current detection terminal of the IGBT 2 to a voltage. An overcurrent detection circuit 8 constituted by a comparator compares a current detection voltage Vs detected by the current detection circuit 7 to a prescribed overcurrent detection threshold voltage Vref in order to detect for overcurrent flowing through the IGBT 2. More specifically, the overcurrent detection circuit 8 detects that when the current detection voltage Vs exceeds the overcurrent detection threshold voltage Vref, the current flowing through the IGBT 2 is overcurrent.

An overcurrent detection signal Soc output from the overcurrent detection circuit 8 is delayed for a prescribed period of time by being passed through a low-pass filter circuit 9 and is then applied to a protection circuit 10 constituted by a logic circuit, for example. This protection circuit 10 changes the duty cycle of the pulse signal output by the driver circuit 4 or completely suspends output of the pulse signal, for example, in order to control the ON/OFF switching of the IGBT 2. This control of the ON/OFF switching of the IGBT 2 prevents any potential damage to the IGBT 2 due to either overcurrent or short-circuit current. Note that the driving device 1 configured in this manner is described in detail in Patent Document 1 and the like, for example.

However, the driving device 1 illustrated in FIG. 9 exhibits problems in detecting overcurrent during turn-on and turn-off of the IGBT 2 due to the device structure of the IGBT 2. In other words, as illustrated in FIG. 10, which shows the changes in voltages and currents during turn-on of the IGBT 2, when a drive voltage at the supply voltage Vcc level is applied to the gate of the IGBT 2 at time t1, this drive voltage causes the gate capacitance (gate-collector capacitance) of the IGBT 2 to begin charging. The charging of this gate capacitance causes the collector-emitter voltage Vce of the IGBT 2 to begin decreasing gradually. As the gate voltage Vg continues to increase and then reaches the on-voltage of the IGBT 2 at time t2, the collector current Ic begins to flow.

Then, when the gate voltage Vg reaches the Miller voltage Vm at time t3, the collector current Ic resulting from the gate voltage Vg flows through the IGBT 2 (Miller period). At this time, the collector current Ic increases rapidly and overshoots due to commutation of the diode in the opposing arm and then transitions to a constant-current state. Moreover, during this Miller period, the gate voltage Vg remains constant due to charging of the gate capacitance and changes in the gate capacitance associated with fluctuations in the collector-emitter voltage Vce of the IGBT 2. Then, when the collector-emitter voltage Vce decreases to 0 V at time t4, the gate voltage Vg begins increasing again, and when the gate voltage Vg reaches the supply voltage Vcc at time t5, the gate voltage Vg becomes constant and the turning ON of the IGBT 2 is completed.

This type of turn-on behavior resulting from the device structure of the IGBT 2 is the same as is described in detail in Patent Document 2 and the like, for example.

RELATED ART DOCUMENTS

Patent Documents

Patent Document 1: Japanese Patent Application Laid-Open Publication No. 2012-23899

Patent Document 2: Japanese Patent Application Laid-Open Publication No. H7-240516

SUMMARY OF THE INVENTION

When the IGBT 2 turns ON, the gate current flowing between the gate and emitter of the IGBT 2 flows from the current detection terminal of the IGBT 2 to the resistor Rs. As illustrated in (c) of FIG. 10, due to the gate current flowing from the current detection terminal, a transient sense voltage Vtr is superimposed onto the current detection voltage Vs detected via the resistor Rs. Particularly during turn-on and turn-off of the IGBT 2, the gate voltage Vg is lower than the supply voltage Vcc. This causes the on-resistance of the IGBT 2 to increase, which in turn causes the transient sense voltage Vtr to increase as well.

Therefore, it is desirable that the transient sense voltage Vtr that occurs during turn-on and turn-off of the IGBT 2 not be misdetected as overcurrent. As described in Patent Document 1, for example, to prevent such misdetections, the gate threshold voltage of a sense IGBT cell should be set to be higher than the gate threshold voltage of a main IGBT cell in the IGBT 2. Alternatively, the overcurrent detection threshold voltage Vref for detecting overcurrent should be set to be higher, or the overcurrent misdetection prevention period should be set to be longer.

However, if the overcurrent misdetection prevention period is set in accordance with the turn-on and turn-off operation characteristics of the IGBT 2, there can be a large time delay in overcurrent detection. Moreover, it is difficult to revise the device structure of the IGBT 2 to adjust the gate threshold voltages as described above in order to eliminate this problematic time delay in overcurrent detection.

The present invention was made in light of the foregoing and aims to provide a semiconductor device driving device having a protection feature which makes it possible to, without being affected by transient sense voltage during turn-on and turn-off, quickly and reliably detect overcurrent flowing through an insulated-gate semiconductor device such as an IGBT.

Additional or separate features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, in one aspect, a semiconductor device driving circuit according to the present disclosure switches ON and OFF a voltage-controlled semiconductor device such as an IGBT and has a feature for protecting the IGBT from thermal breakdown due to overcurrent (short-circuit current), and such a semiconductor device protection circuit for a semiconductor device driving circuit includes: a current detection circuit that detects current flowing through the semiconductor device, and generates and outputs a current detection voltage representing the detected current; an overcurrent detection circuit that compares the current detection voltage to a variable overcurrent detection threshold voltage so as to detect for overcurrent flowing through the semiconductor device; a protection circuit that, when the overcurrent detection circuit detects overcurrent, controls the ON/OFF switching of the semiconductor device so as to prevent thermal breakdown of the semiconductor device; and a gate voltage detection circuit that, in accordance with a gate voltage of the semiconductor device, selectively sets the overcurrent detection threshold voltage to either a first threshold voltage or a second threshold voltage that is lower than the first threshold voltage.

The gate voltage detection circuit may be configured to set the overcurrent detection threshold voltage to the first threshold voltage when the gate voltage is lower than a prescribed reference voltage and to set the overcurrent detection threshold voltage to the second threshold voltage when the gate voltage becomes higher than the prescribed reference voltage. More specifically, when the semiconductor device is being turned-on or turned-off and the gate voltage is lower than the prescribed reference voltage, the gate voltage detection circuit sets the first threshold voltage Vref1 for the overcurrent detection circuit. Moreover, when the semiconductor device is in the ON state and the gate voltage becomes higher than the prescribed reference voltage, the second threshold voltage Vref2 is set for the overcurrent detection circuit. This way, even if the current detection voltage Vs overshoots due to superposition of transient sense voltage Vtr at turn-on or turn-off of the semiconductor device, that does not result in a misdetection of the overcurrent condition.

The semiconductor device may be an IGBT having a current detection terminal that outputs a current proportional to the current flowing through the semiconductor device between a collector and an emitter, for example. Moreover, the semiconductor device may be configured to have a current detection terminal that outputs current proportional to the current flowing through the semiconductor device, and the current detection circuit may be configured to convert, via a resistor, a sense current that is output from the current detection terminal of the semiconductor device to a voltage so as to generate the current detection voltage.

The semiconductor device protection circuit according to the present disclosure may further include, in addition to the configuration described above: a timing adjustment circuit that, in accordance with the gate voltage of the semiconductor device, adjusts a timing at which the protection circuit begins operating.

During turn-on and turn-off of the semiconductor device, the timing adjustment circuit may delay the timing at which the protection circuit begins operating by a prescribed period of time in order to prevent misdetection of overcurrent. More specifically, the timing adjustment circuit may include a delay circuit which delays an overcurrent detection signal Soc that is output by the overcurrent detection circuit and then applies the delayed overcurrent signal to the protection circuit, and the timing adjustment circuit may be configured to change a delay time of the delay circuit in accordance with the gate voltage of the semiconductor device.

In the semiconductor device driving device according to the present disclosure, the overcurrent detection threshold voltage of the overcurrent detection circuit is changed in accordance with the gate voltage of the semiconductor device. More specifically, when the gate voltage is lower than the prescribed gate reference voltage, the first threshold voltage is set as the overcurrent detection threshold voltage. Moreover, when the gate voltage is higher than the prescribed gate reference voltage, the second threshold voltage which is lower than the first threshold voltage is set as the overcurrent detection threshold voltage.

Therefore, when the gate voltage is lower than the prescribed gate reference voltage, the overcurrent detection threshold voltage is set to a higher value (the first threshold voltage), which makes it possible to reliably detect overcurrent in a manner which is not affected by increases in transient sense voltage Vtr. Meanwhile, when the gate voltage is applied, the overcurrent detection threshold voltage is set to a lower value (the second threshold voltage). In this state, when short-circuits or the like in the semiconductor device occurs, the collector current increases. When this happens, the current detection voltage becomes higher than the overcurrent detection threshold voltage. This makes it possible to quickly and reliably detect overcurrent due to short-circuits or the like in the semiconductor device after only a short time delay. This, in turn, makes it possible to quickly activate the overcurrent protection feature, thereby making it possible to effectively suppress such overcurrent. This also makes it possible to effectively prevent device damage or the like caused by such overcurrent.

Furthermore, using the configuration described above in combination with a technology for controlling the overcurrent detection period in accordance with the gate voltage achieves additional advantageous effects such as making it possible to detect overcurrent during turn-on and turn-off even more reliably and quickly.

DETAILED DESCRIPTION OF EMBODIMENTS

Next, embodiments of the semiconductor device driving device according to the present disclosure will be described with reference to figures.

Figure 1:
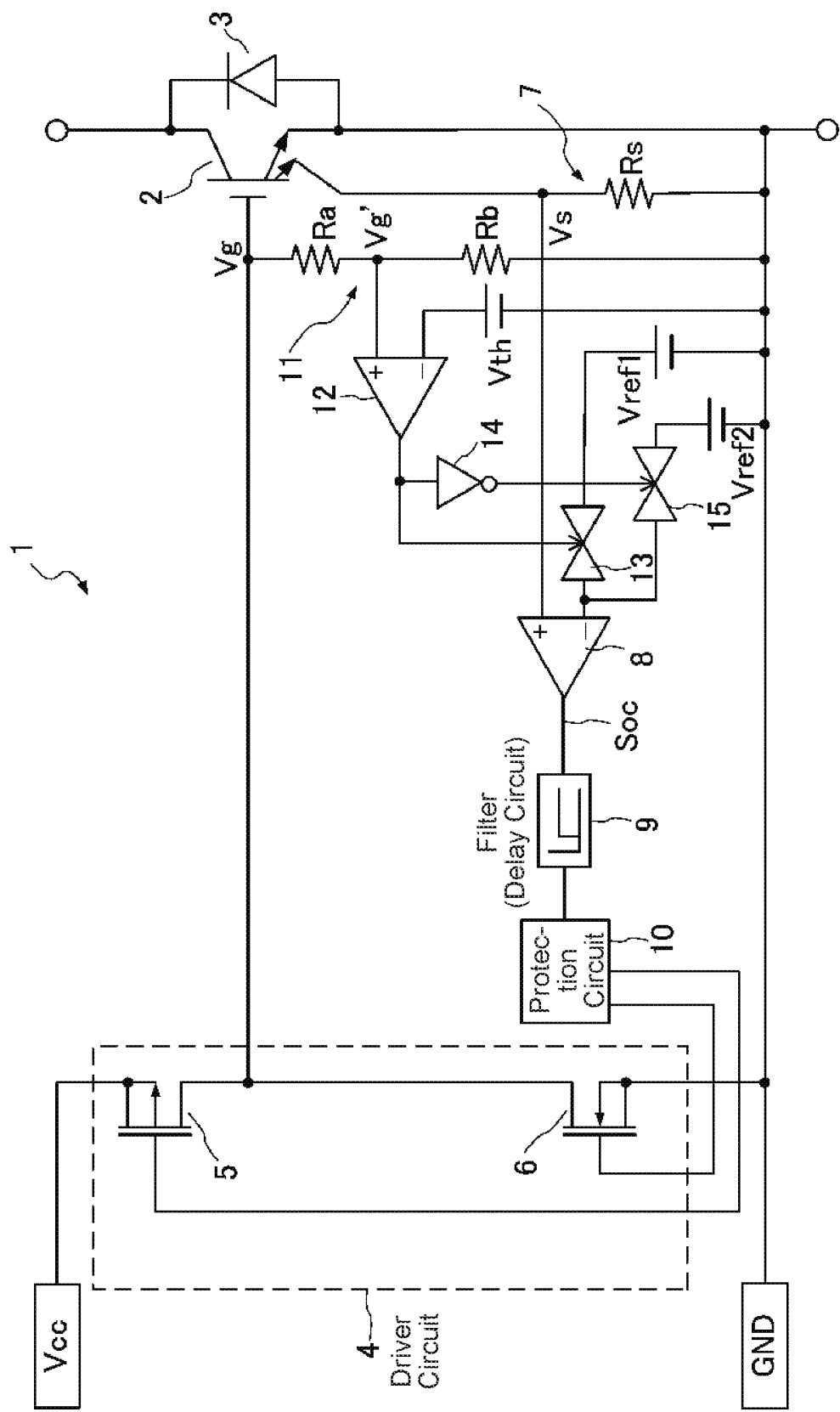
FIG. 1 schematically illustrates a configuration of the primary components of a semiconductor device driving device according to Embodiment 1 of the present invention.

FIG. 1 schematically illustrates a configuration of the primary components of a semiconductor device driving device according to Embodiment 1 of the present invention. Note that the same reference characters are used for components which are the same as in the conventional semiconductor device driving device 1 illustrated in FIG. 9, and descriptions of such components will be omitted here.

Figure 9:
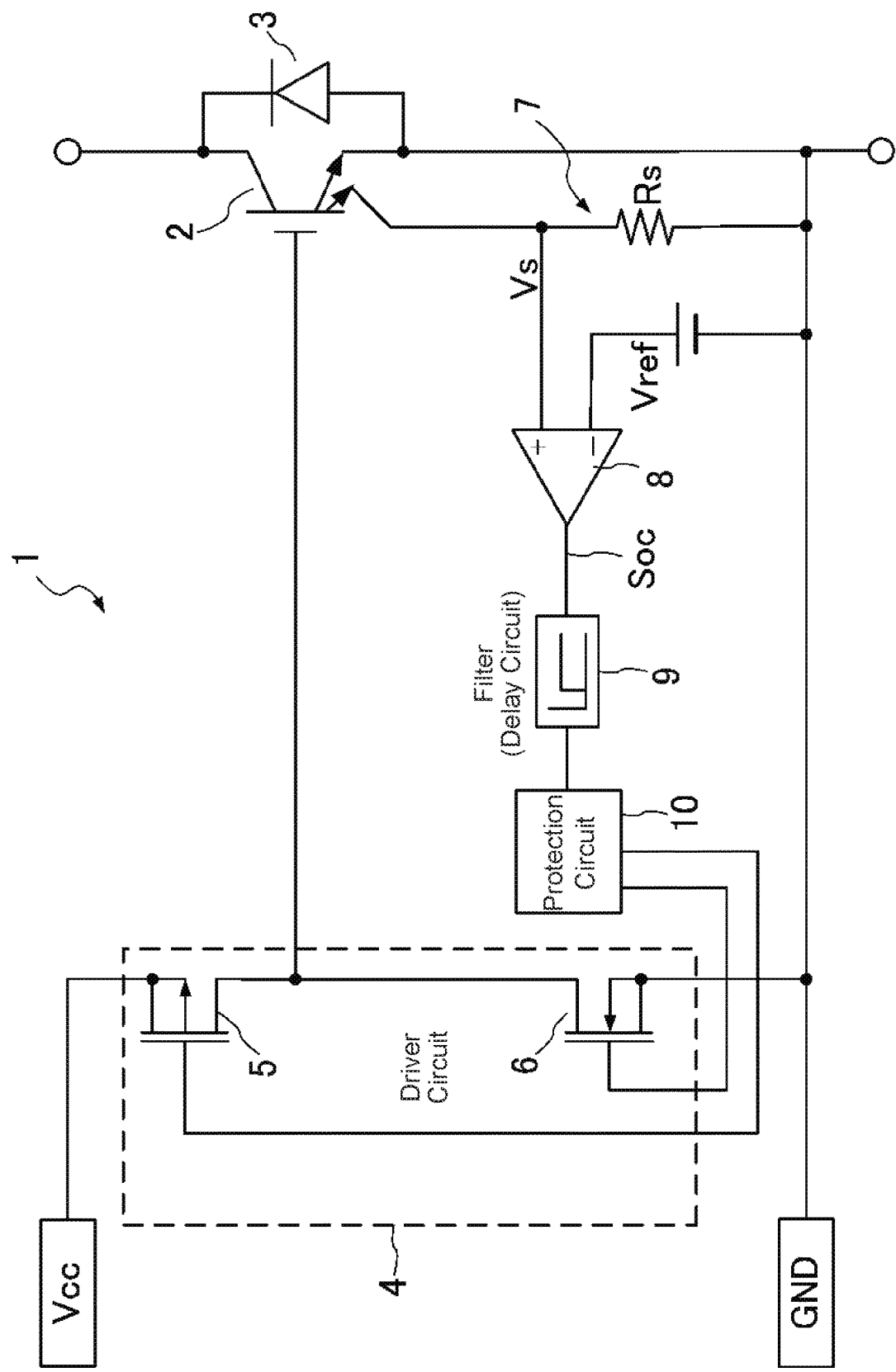
FIG. 9 schematically illustrates the configuration of the primary components of conventional semiconductor device driving device having an overcurrent protection feature.
Figure 10:
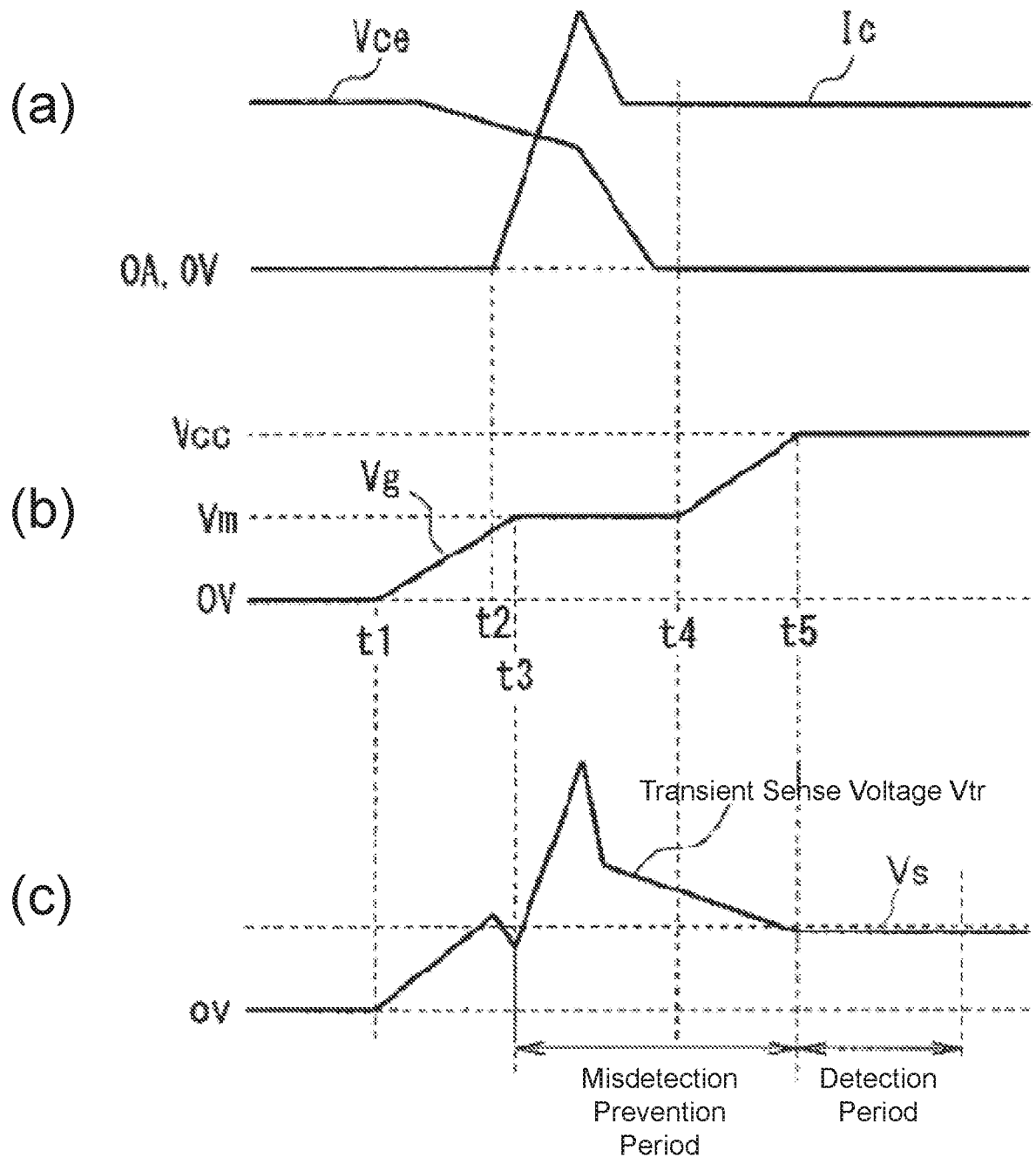
FIG. 10 is a figure for explaining changes in voltages and currents during turn-on of an IGBT, and an overcurrent detection problem caused by transient sense voltage.

One characterizing feature of a semiconductor device driving device 1 according to the present embodiment is the inclusion of a gate voltage detection circuit 11 for detecting the gate voltage of an IGBT 2 in addition to the basic configuration included in the driving device 1 illustrated in FIG. 9. This gate voltage detection circuit 11 includes a voltage-dividing circuit which is constituted by series-connected voltage-dividing resistors Ra and Rb and divides and detects a gate voltage Vg of the IGBT 2. A comparator 12 compares a gate detection voltage Vg', which is detected as the gate voltage detection circuit 11 constituted by the voltage-dividing circuit divides the gate voltage Vg, to a prescribed gate reference voltage Vth. The comparator 12 then determines whether the gate voltage Vg (the gate detection voltage Vg') is higher than a prescribed gate reference voltage VTH (the gate reference voltage Vth). More specifically, the comparator 12 determines whether the gate detection voltage Vg' is higher than the gate reference voltage Vth.

Note that in the following description, the comparison between the gate detection voltage Vg' and the gate reference voltage Vth is described as being a comparison between the gate voltage Vg and the gate reference voltage VTH for simplicity. Moreover, a drive signal applied to the gate of the IGBT 2 takes either of two values (a supply voltage Vcc or a ground voltage (0 V)), and when the maximum level of the gate voltage Vg is equal to the supply voltage Vcc, the gate reference voltage VTH is set to be less than the supply voltage Vcc by a prescribed voltage level.

When the gate voltage Vg is lower than the prescribed gate reference voltage VTH, the gate voltage detection circuit 11 switches ON a first switch circuit 13 and also switches OFF a second switch circuit 15 via an inverting circuit 14. Moreover, when the gate voltage Vg is higher than the prescribed gate reference voltage VTH, the gate voltage detection circuit 11 switches OFF the first switch circuit 13 and also switches ON the second switch circuit 15 via the inverting circuit 14.

As only one of the first and second switch circuits 13 and 15 is switched ON at a time in this manner, the first and second switch circuits 13 and 15 select either a first threshold voltage Vref1 or a second threshold voltage Vref2 which is lower than the first threshold voltage Vref1 (that is, Vref2<Vref1) and apply the selected voltage to an overcurrent detection circuit 8 constituted by a comparator for use as an overcurrent detection threshold voltage.

Thus, when the IGBT 2 is in the ON state, the gate voltage Vg is kept at the supply voltage Vcc, and therefore the gate voltage Vg is higher than the gate reference voltage VTH. As a result, the second threshold voltage Vref2 is set for the overcurrent detection circuit 8 as the overcurrent detection threshold voltage, and overcurrent detection (short-circuit detection) is performed under these conditions.

In contrast, during turn-on of the IGBT 2, the gate voltage Vg increases from the ground voltage (0 V) to the supply voltage Vcc, and during turn-off, the gate voltage Vg decreases from the supply voltage (Vcc) to the ground voltage (0 V). As a result, during these transition periods the gate voltage Vg becomes lower than the gate reference voltage VTH. When the gate voltage Vg is lower than the gate reference voltage VTH, the first threshold voltage Vref1 is set to the overcurrent detection circuit 8 as the overcurrent detection threshold voltage.

Therefore, in the driving device 1 configured as described above, when the IGBT 2 is being operated in the ON state and the gate voltage Vg is kept at the supply voltage Vcc, the overcurrent detection circuit (comparator) 8 has the second threshold voltage Vref2 set thereto and detects for overcurrent in that state. In this state, when overcurrent flows through the IGBT 2 due to a short-circuit or the like, a current detection voltage Vs increases due to the overcurrent. If the current detection voltage Vs detected in this manner exceeds the second threshold voltage Vref2, the overcurrent detection circuit (comparator) 8 detects that an overcurrent has occurred.

On the other hand, during the turn-on process of the IGBT 2, for example, the gate voltage Vg gradually increases from the ground voltage (0 V) to the supply voltage Vcc. Therefore, as described above, at the beginning of this turn-on process the gate voltage Vg is lower than the gate reference voltage VTH. As a result, the first threshold voltage Vref1 is set for the overcurrent detection circuit 8 as the overcurrent detection threshold voltage. The first threshold voltage Vref1 is set to a voltage value which accounts for temporary increases in the current detection voltage Vs associated with occurrence of transient sense voltage or superposition of voltage noise onto the gate voltage Vg.

Therefore, even if the current detection voltage Vs increases temporarily due to the transient sense voltage that occurs during turn-on, this temporary increase in the current detection voltage Vs is not misdetected as overcurrent because the first threshold voltage Vref1 is set in the overcurrent detection circuit 8. Then, when the turn-on process is complete to let the IGBT 2 be in the ON state, and the gate voltage Vg increases to the supply voltage Vcc and thus becomes higher than the gate reference voltage VTH, the second threshold voltage Vref2 is applied to the overcurrent detection circuit (comparator) 8.

Figure 2:
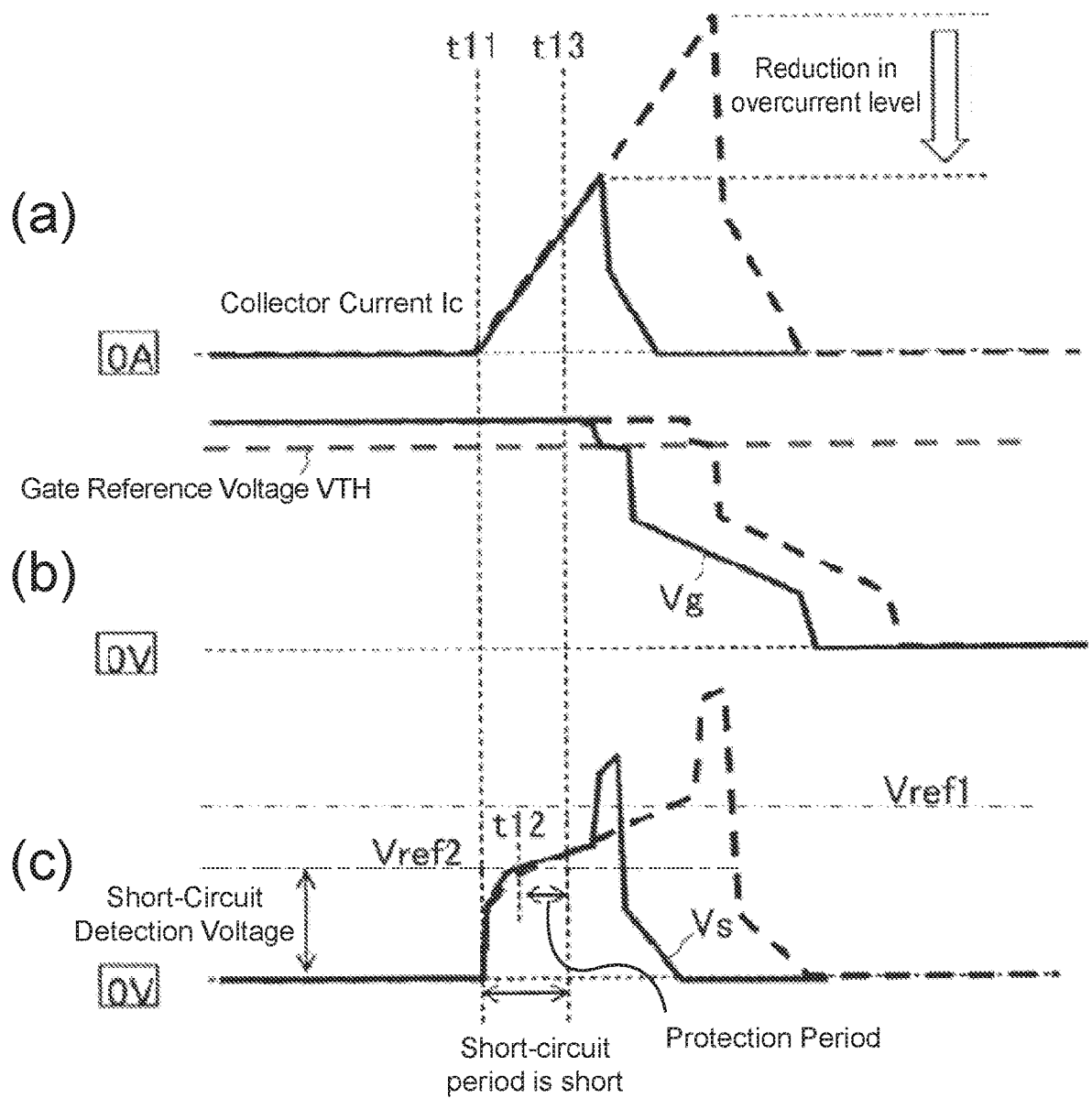
FIG. 2 illustrates an overcurrent detection operation during turn-on in the driving device illustrated in FIG. 1.

FIG. 2 illustrates an overcurrent detection operation in the driving device (control device) 1 illustrated in FIG. 1 for a case in which overcurrent occurs when the IGBT 2 is in the ON state. As illustrated in (a) and (b) of FIG. 2, in a state in which the gate voltage Vg of the IGBT 2 is at the supply voltage Vcc and no current is being output to a load, for example, the collector current Ic of the IGBT 2 is equal to zero. Therefore, as illustrated in (c) of FIG. 2, the current detection voltage Vs detected at this time is also equal to zero. Moreover, as illustrated in (b) of FIG. 2, in this ON state the gate voltage Vg of the IGBT 2 is kept at the supply voltage Vcc and thus remains higher than the prescribed gate reference voltage VTH. As a result, the second threshold voltage Vref2 is set for the overcurrent detection circuit (comparator) 8.

In this state, if a short-circuit current begins flowing through the IGBT 2 at time t11 due to a short-circuit, as illustrated in (a) of FIG. 2, for example, this causes the collector current Ic to begin increasing from 0 A. Moreover, as illustrated in (a) of FIG. 2, this increase in the collector current Ic causes the current detection voltage Vs to increase. When the current detection voltage Vs then exceeds the second threshold voltage Vref2 at time t12, the overcurrent detection circuit (comparator) 8 outputs an overcurrent detection signal Soc.

This overcurrent detection signal Soc is then input to a protection circuit 10 via a timing adjustment circuit (low-pass filter circuit) 9. Upon receiving as input the timing-adjusted overcurrent detection signal Soc (a signal Sf1 (described later)), the protection circuit 10 controls the output of a driver circuit 4 and so on to decrease the gate voltage Vg of the IGBT 2, for example. This decrease in the gate voltage Vg is achieved by forcibly switching OFF a p-type MOSFET 5 and simultaneously switching ON an n-type MOSFET 6, for example. As a result, as illustrated in (b) of FIG. 2, the gate voltage Vg begins to be turned OFF after a prescribed time delay, and the IGBT 2 is switched OFF.

As the gate voltage Vg decreases, when the gate voltage Vg becomes lower than the gate reference voltage VTH, the overcurrent detection threshold voltage set in the overcurrent detection circuit (comparator) 8 is switched from the second threshold voltage Vref2 to the first threshold voltage Vref1, as illustrated in (c) of FIG. 2.

Therefore, as illustrated in (c) FIG. 2, in the driving device 1 configured as described above, if an overcurrent occurs when the IGBT 2 is in the ON state, this overcurrent is quickly detected due to the comparison of the current detection voltage Vs to the second threshold voltage Vref2, and an overcurrent protection operation is activated. As a result, as illustrated in (a) of FIG. 2, it is possible to activate the overcurrent protection operation in order to block the collector current Ic as well as overcurrent caused by a short-circuit before such overcurrent (collector current Ic) caused by a short-circuit becomes excessively large.

In a conventional driving device 1 in which the overcurrent detection threshold voltage is set to the first threshold voltage Vref1 regardless of the gate voltage Vg, for example, an overcurrent is detected when the current detection voltage Vs exceeds the first threshold voltage Vref1, as illustrated by the dashed line in (a) of FIG. 2. As a result, it takes a long time to detect an overcurrent after that overcurrent occurs.

Moreover, as illustrated in (a) of FIG. 2, during this delay until the overcurrent is detected, the overcurrent continues to increase in magnitude with time.

Therefore, in comparison with such a conventional driving device 1 in which the overcurrent detection threshold voltage is set to a fixed value, the present embodiment makes it possible to keep the level of overcurrent lower, thereby reducing undesirable heat generation in the IGBT 2 and making it possible to reduce any damage applied to the IGBT 2.

Figure 3:
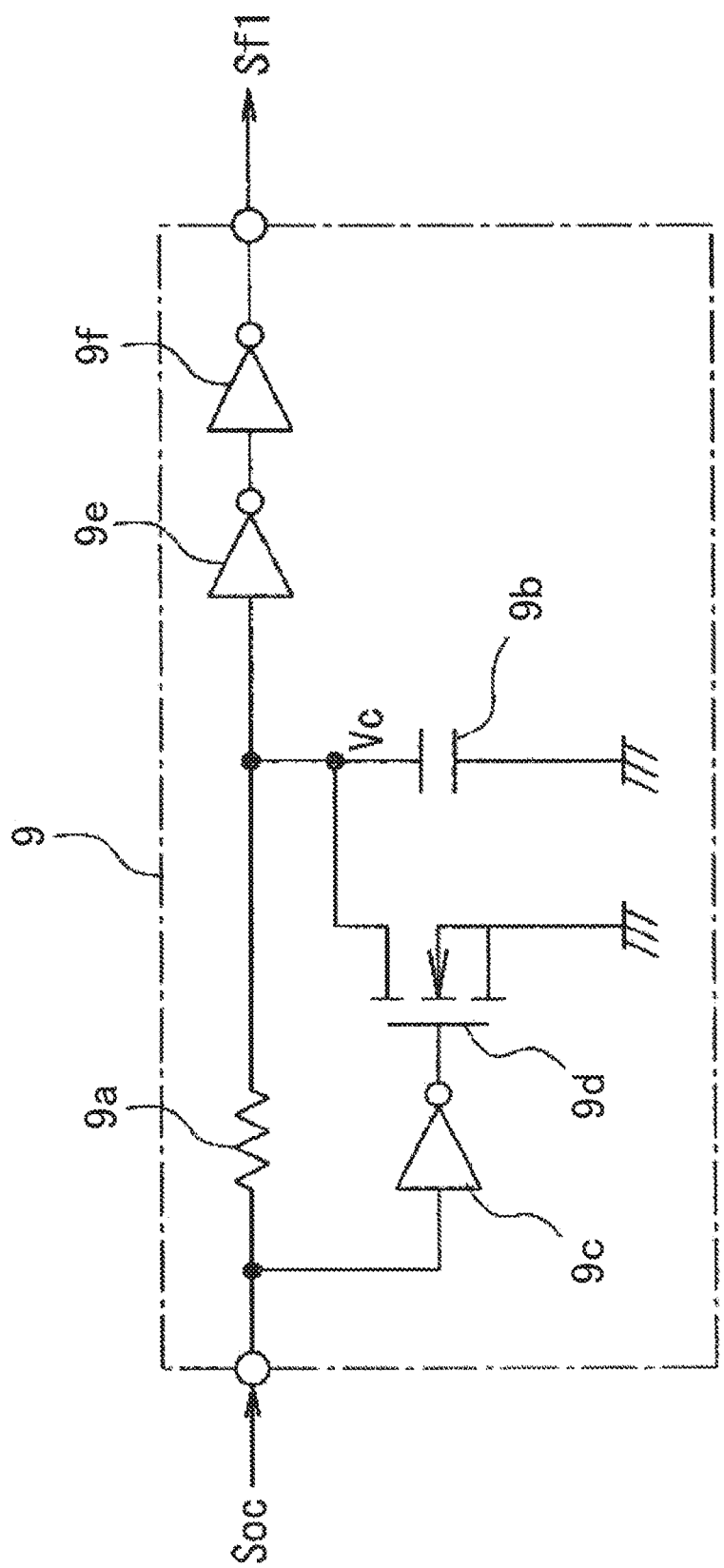
FIG. 3 illustrates an example configuration of a filter circuit (timing adjustment circuit) in the driving device illustrated in FIG. 1.

Next, the low-pass filter circuit 9 which serves as a delay circuit for delaying the overcurrent detection signal Soc before applying that signal to the protection circuit 10 will be briefly described. As illustrated in FIG. 3 for an example, the low-pass filter circuit 9 includes a capacitor 9*b* which, when the overcurrent detection signal Soc is at a high level, is charged upon receiving the voltage of the overcurrent detection signal Soc via an input resistor 9*a*, and a MOSFET 9*d* which, when the overcurrent detection signal Soc is at a low level, is switched ON via an inverting circuit 9*c* to discharge the charge stored in the capacitor 9*b*. Two-stage inverting circuits 9*e* and 9*f* connected in series to the output stage of the low-pass filter circuit 9 compare the charge voltage Vc of the capacitor 9*b* to a prescribed inversion threshold voltage and invert the charge voltage Vc so as to generate the signal Sf1 to output to the protection circuit 10.

Figure 4:
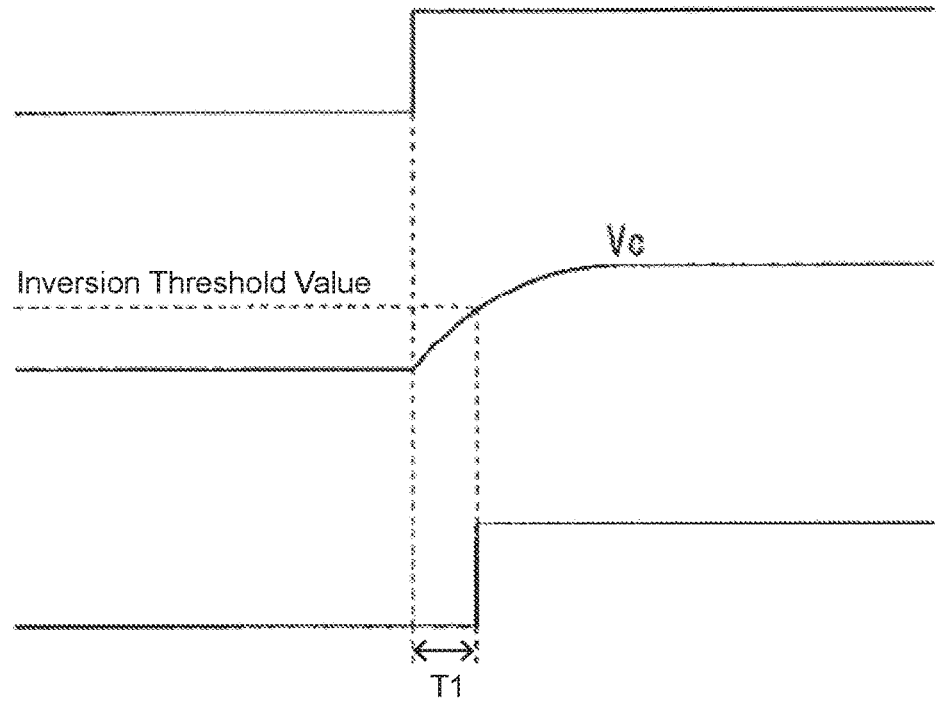
FIG. 4 illustrates the operation of the filter circuit (timing adjustment circuit) illustrated in FIG. 3.

As illustrated in (a) and (b) of FIG. 4, in the low-pass filter circuit 9 configured in the above-described manner as a delay circuit, the capacitor 9*b* begins charging when the overcurrent detection signal Soc takes the high level. As the capacitor 9*b* continues charging, when the charge voltage Vc exceeds the prescribed inversion threshold voltage, the inverting circuits 9*e* and 9*f* sequentially invert the charge voltage, and therefore as illustrated in (c) of FIG. 4, the signal Sf1 is output after a delay equal to a prescribed period of time T1 from when the overcurrent detection signal Soc took the high level. This controlled delay of the overcurrent detection signal Soc by the low-pass filter circuit 9 makes it possible to avoid conflicts between the overcurrent detection operation and the overcurrent protection operation, thereby improving operating stability.

Figure 5:
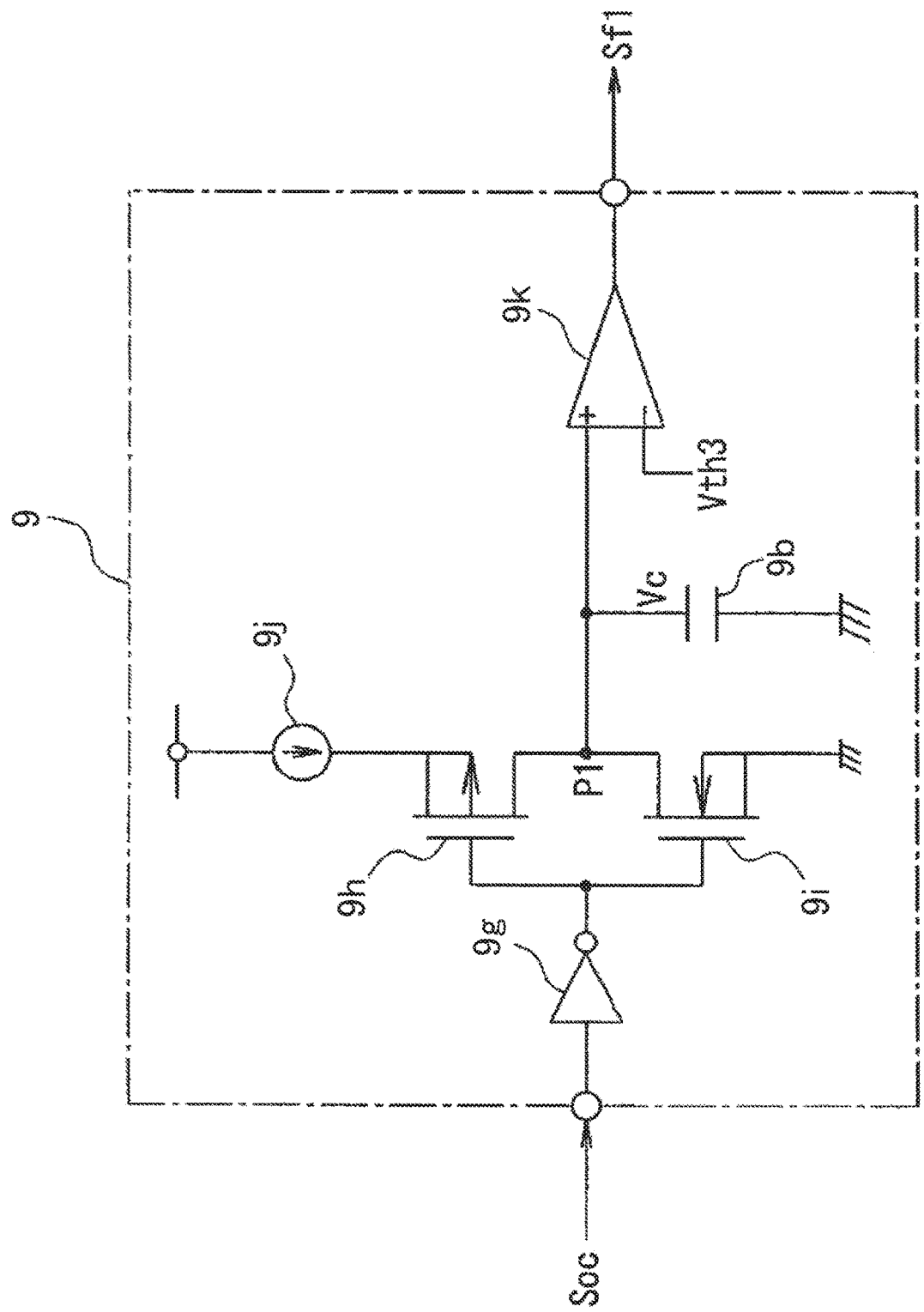
FIG. 5 illustrates another example configuration of a filter circuit (timing adjustment circuit) in the driving device illustrated in FIG. 1.

Furthermore, the low-pass filter circuit 9 can also be configured as illustrated in FIG. 5, for example. This low-pass filter circuit 9 includes a pair of a p-type MOSFET 9*h* and an n-type MOSFET 9*i* which are cascade-connected between the supply voltage Vcc and the ground voltage (0 V). An inverting circuit 9*g* takes as input and inverts the overcurrent detection signal Soc, and the resulting output switches the p-type MOSFET 9*h* and the n-type MOSFET 9*i* ON and OFF in a complementary manner.

The p-type MOSFET 9*h* switches ON to charge the capacitor 9*b* with constant current from a constant current source 9*j*, and the n-type MOSFET 9*i* switches ON to discharge the charge stored in the capacitor 9*b*. A comparator 9*k* compares the charge voltage Vc of the capacitor 9*b* resulting from this charging/discharging behavior to a prescribed threshold voltage in order to generate the signal Sf1 to output to the protection circuit 10.

Figure 6:
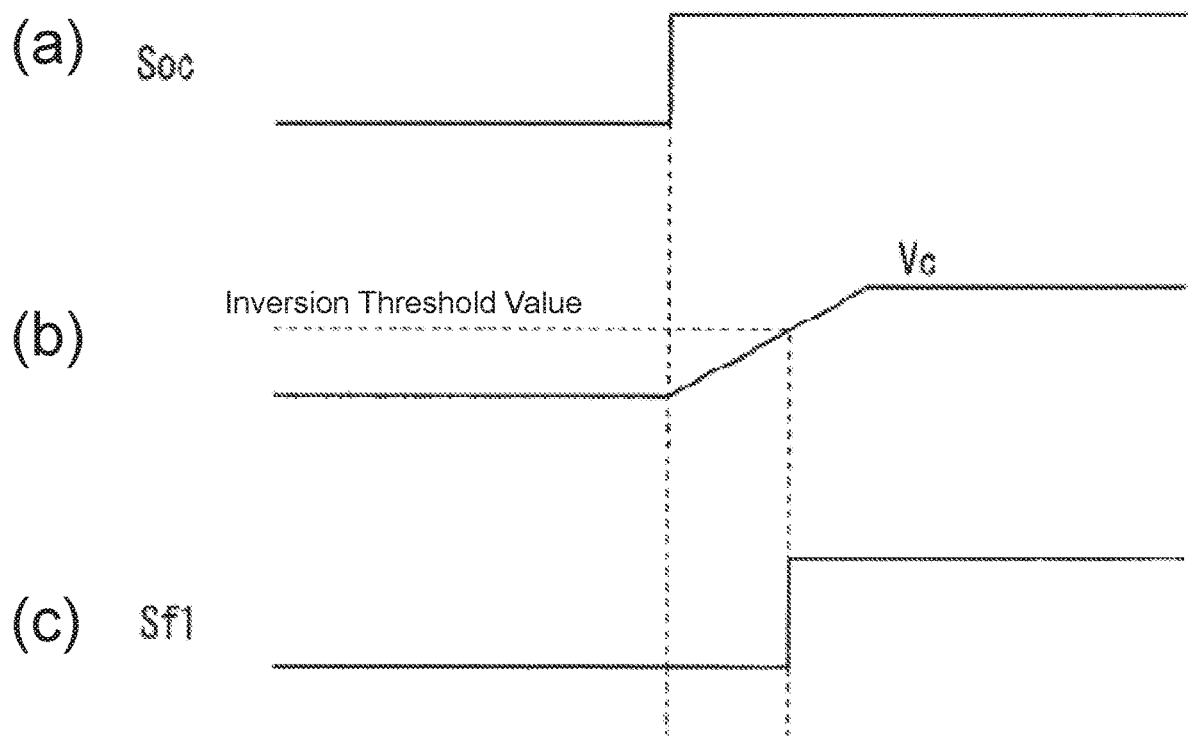
FIG. 6 illustrates the operation of the filter circuit (timing adjustment circuit) illustrated in FIG. 5.

In the low-pass filter circuit 9 configured as described above, the capacitor 9*b* is charged by a constant current, and therefore as illustrated in FIG. 6, the charge voltage Vc of the capacitor 9*b* changes linearly with constant slope. This makes it possible to more accurately set the delay time from when the overcurrent detection signal Soc takes the high level until when the signal Sf1 is output in the comparator 9*k* that compares the charge voltage Vc of the capacitor 9*b* to the prescribed threshold voltage.

Figure 7:
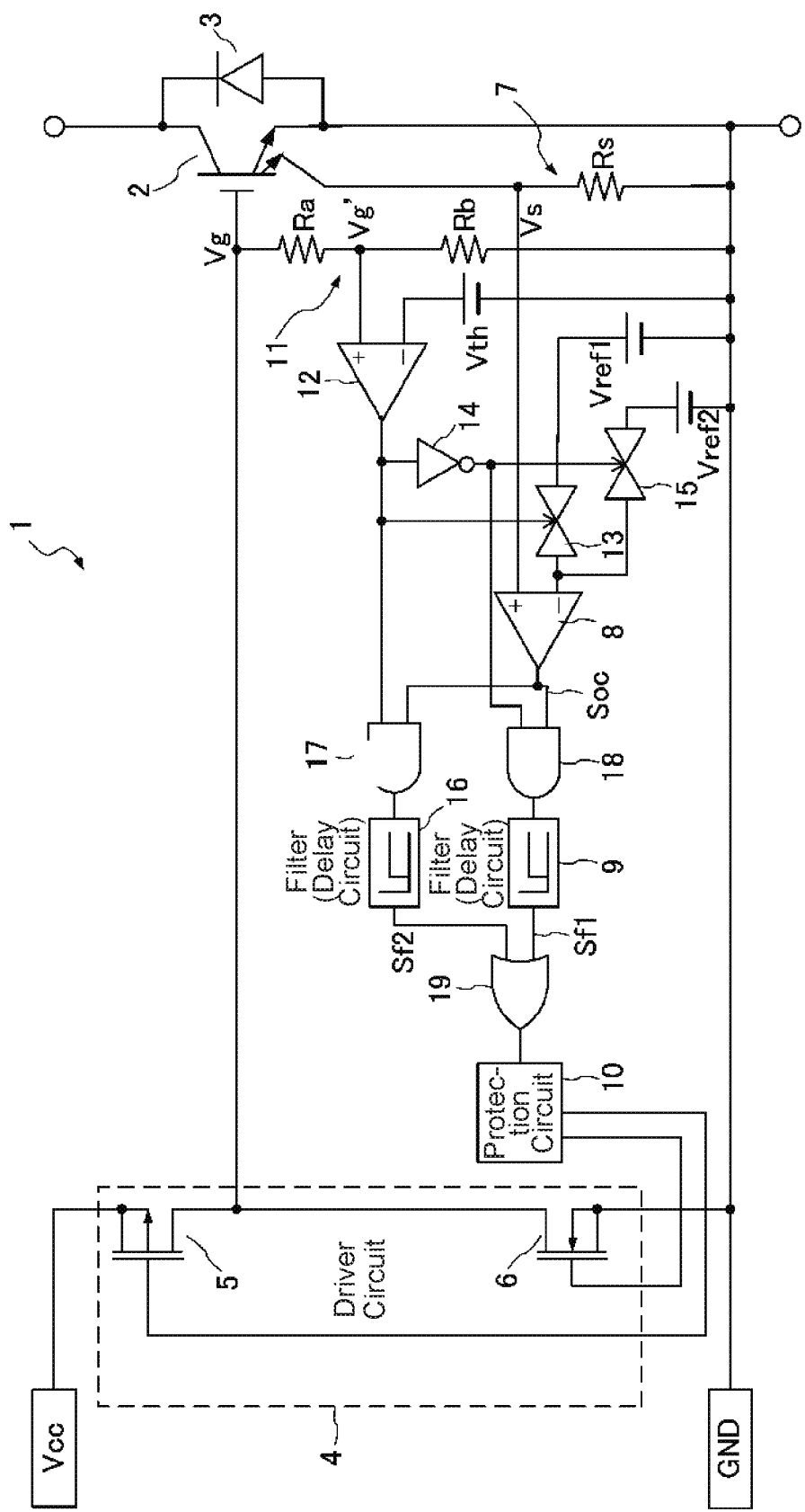
FIG. 7 schematically illustrates a configuration of the primary components of a semiconductor device driving device according to Embodiment 2 of the present invention.

Next, a semiconductor device driving device 1 according to Embodiment 2 of the present disclosure will be described with reference to FIG. 7.

The driving device 1 according to Embodiment 2 includes, in addition to the basic configuration of the driving device 1 illustrated in FIG. 1, a second low-pass filter circuit 16 connected in parallel to the low-pass filter circuit 9. When the gate voltage Vg is higher than the gate reference voltage VTH, this second low-pass filter circuit 16 is activated upon receiving the overcurrent detection signal Soc output by the comparator 8 via an AND gate circuit 17 in which the gate is opened upon receipt of the output of the comparator 12. When the gate voltage Vg is lower than the gate reference voltage VTH, the low-pass filter circuit 9 is activated upon receiving the overcurrent detection signal Soc output by the comparator 8 via an AND gate circuit 18 in which the gate is opened upon receipt of the output of the inverting circuit 14. In other words, the AND gate circuits 17 and 18 open one at a time in accordance with the gate voltage Vg so as to input the overcurrent detection signal Soc to either the second low-pass filter circuit 16 or the low-pass filter circuit 9.

Furthermore, the second low-pass filter circuit 16 outputs a signal Sf2 generated by delaying the overcurrent detection signal Soc for a prescribed period of time such as 4 μsec. Moreover, as described above, the low-pass filter circuit 9 outputs the signal Sf1 generated by delaying the overcurrent detection signal Soc for a prescribed period of time such as 1 μsec. The signal Sf2 output by the second low-pass filter circuit 16 and the signal Sf1 output by the low-pass filter circuit 9 are applied to the protection circuit 10 via an OR circuit 19.

The second low-pass filter circuit 16 is configured in substantially the same manner as the low-pass filter circuit 9 as illustrated in FIG. 3 or 5, for example. However, the low-pass filter circuits 9 and 16 have different delay times Td1 and Td2 by which the overcurrent detection signal Soc is delayed before output of the signals Sf1 and Sf2. More specifically, these different delay times Td1 and Td2 for the low-pass filter circuits 9 and 16 are achieved by changing the charging time constant of the capacitor 9b or by changing the charging current of the capacitor 9b.

The control device 1 configured as described above thus makes it possible to, on the basis of the gate voltage Vg, switch between the delay times Td1 and Td2, which determine the so-called overcurrent operation protection period from when overcurrent is detected by the comparator 8 until when the protection circuit 10 starts working.

Figure 8:
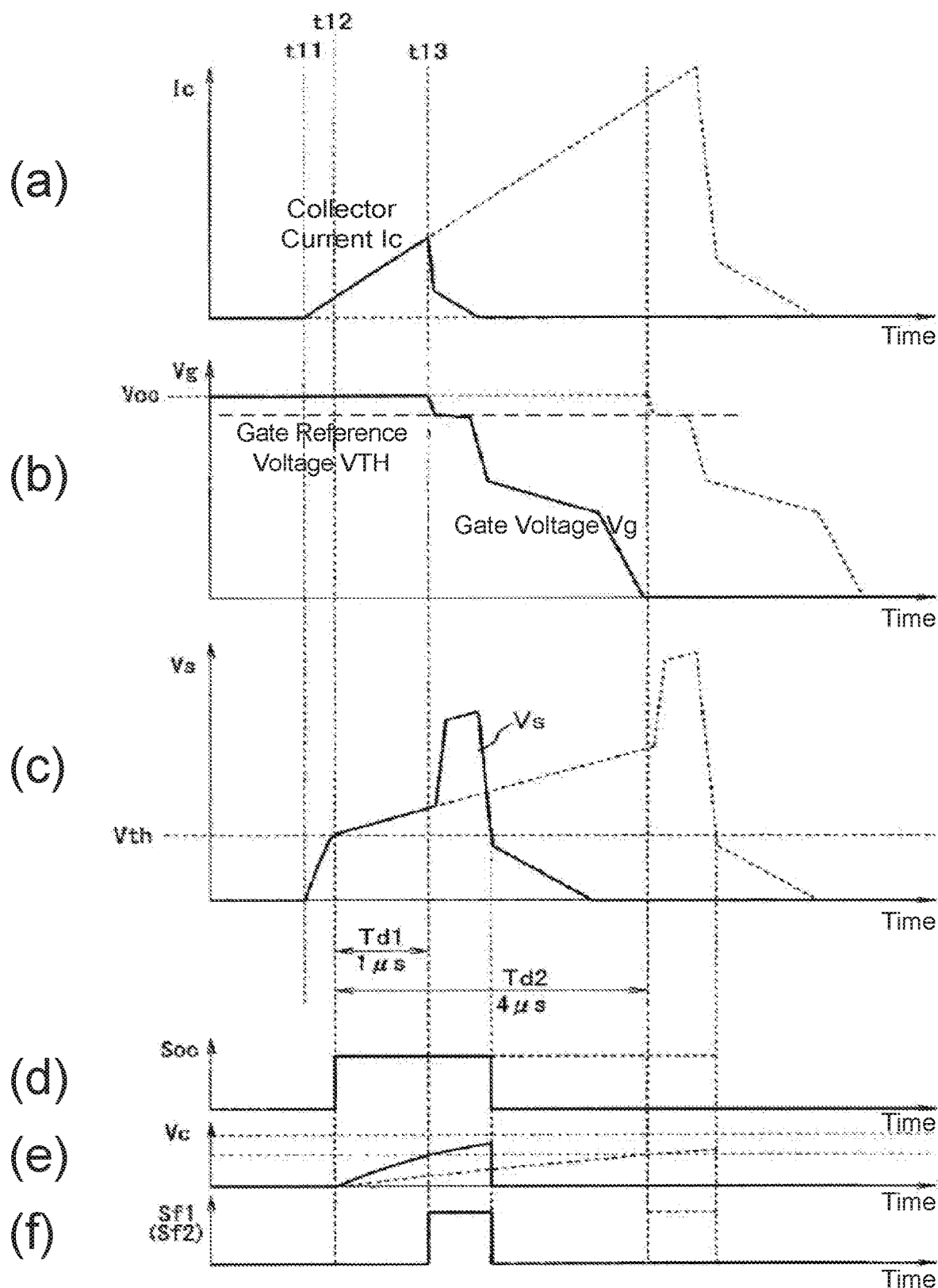
FIG. 8 illustrates an overcurrent detection operation in the driving device illustrated in FIG. 7.

In other words, as illustrated by the operation waveforms in FIG. 8 for a case in which overcurrent has occurred, when the gate voltage Vg is higher than the gate reference voltage VTH, the second threshold voltage Vref2 is set for the comparator 8. Moreover, as illustrated by the dashed line in (d) of FIG. 8, when the current detection voltage Vs exceeds the second threshold voltage Vref2, the comparator 8 outputs the overcurrent detection signal Soc. In this case, the AND gate circuit 17 is opened and the AND gate circuit 18 is closed, and therefore the overcurrent detection signal Soc output by the comparator 8 is input only to the second low-pass filter circuit 16.

As a result, as illustrated by the dashed line in (f) of FIG. 8, after the prescribed delay time Td2 (such as 4 μsec) has elapsed from a time t12 at which the overcurrent was detected, the second low-pass filter circuit 16 outputs the signal Sf2 and thereby triggers the protection circuit 10. This makes it possible to prevent erroneous activation of overcurrent protection due to misdetection of overcurrent for a sufficient margin of time.

Meanwhile, as described in the embodiment above, when the gate voltage Vg is lower than the gate reference voltage VTH, the first threshold voltage Vref1 is set for the comparator 8. Moreover, as illustrated by the solid line in (d) of FIG. 8, when the current detection voltage Vs exceeds the first threshold voltage Vref1, the comparator 8 outputs the overcurrent detection signal Soc. In this case, the AND gate circuit 17 is closed and the AND gate circuit 18 is opened, and therefore the overcurrent detection signal Soc output by the comparator 8 is input only to the low-pass filter circuit 9.

As a result, as illustrated by the solid line in (f) of FIG. 8, after the prescribed delay time Td1 (such as 1 μsec) has elapsed from the time t12 at which the overcurrent was detected, the low-pass filter circuit 9 outputs the signal Sf1 and thereby triggers the protection circuit 10. Therefore, as illustrated in (a) of FIG. 8, the protection circuit 10 can perform the overcurrent protection operation after only a slight time delay from when the overcurrent occurred, which makes it possible to keep the level of overcurrent low.

More specifically, as described above, when the gate voltage Vg is lower than the gate reference voltage VTH, the first threshold voltage Vref1 is set to the comparator 8. The comparator 8 only outputs the overcurrent detection signal Soc when the current detection voltage Vs exceeds this first threshold voltage Vref1, which is higher than the second threshold voltage Vref2. Furthermore, in this state the AND gate circuit 18 receives the output of the comparator 12 and opens. As a result, the overcurrent detection signal Soc output by the comparator 8 is input to the low-pass filter circuit 9.

Thus, by changing the overcurrent detection threshold voltage in accordance with the gate voltage Vg as described above, and by also changing the delay time (overcurrent operation protection period) from when overcurrent is detected until when the overcurrent protection operation is triggered in accordance with the gate voltage Vg as described above, the present embodiments make it possible to reliably prevent misdetection of overcurrent due to voltage noise. The present embodiments also make it possible to quickly detect overcurrent due to transient sense voltage, short-circuits or the like and then proceed to activate the overcurrent protection operation.

Moreover, because the occurrence of overcurrent due to short-circuits or the like can be detected quickly, it is possible to detect such overcurrent while the overcurrent level is still low. This also makes it possible to activate the overcurrent protection operation quickly. Therefore, the present embodiments exhibit advantageous effects such as making it possible to significantly reduce the amount of overcurrent (the amount of overcurrent energy) flowing through the IGBT 2.

It should be noted that the present invention is not limited to the embodiments described above. Although here the voltage-controlled semiconductor device was described as being an IGBT as an example, the present invention is equally applicable to cases in which this semiconductor device is a power MOSFET. Moreover, the gate reference voltage VTH (Vth) against which the gate voltage Vg (Vg') is compared may be set in accordance with the device characteristics of the IGBT or power MOSFET used. Similarly, the first threshold voltage Vref1 and the second threshold voltage Vref2 that are selectively set as the overcurrent detection threshold voltage may also be set in accordance with the device characteristics of the semiconductor device. In addition, various other modifications can be made without departing from the spirit of the present invention.

It will be apparent to those skilled in the art that various modifications and variations can be made in the present invention without departing from the spirit or scope of the invention. Thus, it is intended that the present invention cover modifications and variations that come within the scope of the appended claims and their equivalents. In particular, it is explicitly contemplated that any part or whole of any two or more of the embodiments and their modifications described above can be combined and regarded within the scope of the present invention.

What is claimed is:

1. A semiconductor device protection circuit for a semiconductor device driving circuit that switches a voltage-controlled semiconductor device ON and OFF, comprising:
   a current detection circuit that detects current flowing through the semiconductor device, and generates and outputs a current detection voltage representing the detected current;
   an overcurrent detection circuit that compares the current detection voltage to a variable overcurrent detection threshold voltage so as to detect for overcurrent flowing through the semiconductor device;
   a protection circuit that, when the overcurrent detection circuit detects overcurrent, controls the ON/OFF switching of the semiconductor device so as to prevent thermal breakdown of the semiconductor device;
   a gate voltage detection circuit that, in accordance with a gate voltage of the semiconductor device, selectively sets the overcurrent detection threshold voltage to either a first threshold voltage or a second threshold voltage that is lower than the first threshold voltage; and
   a timing adjustment circuit that, in accordance with the gate voltage of the semiconductor device, adjusts a timing at which the protection circuit begins operating,
   wherein the timing adjustment circuit comprises a delay circuit which delays an overcurrent detection signal that is output by the overcurrent detection circuit and then applies the delayed overcurrent detection signal to the protection circuit, and the timing adjustment circuit changes a delay time of the delay circuit in accordance with the gate voltage of the semiconductor device.

2. The semiconductor device protection circuit according to claim 1, wherein the gate voltage detection circuit sets the overcurrent detection threshold voltage to the first threshold voltage when the gate voltage is lower than a prescribed gate reference voltage and sets the overcurrent detection threshold voltage to the second threshold voltage when the gate voltage is higher than the prescribed gate reference voltage.

3. The semiconductor device protection circuit according to claim 1, wherein the semiconductor device is an IGBT having a current detection terminal that outputs current proportional to the current flowing through the semiconductor device between a collector and an emitter.

4. The semiconductor device protection circuit according to claim 1,
   wherein the semiconductor device has a current detection terminal that outputs current proportional to the current flowing through the semiconductor device, and
   wherein the current detection circuit converts a sense current that is output from the current detection terminal of the semiconductor device to a voltage via a resistor so as to generate the current detection voltage.

5. The semiconductor device protection circuit according to claim 1, wherein the gate voltage detection circuit sets the overcurrent detection threshold voltage to the second threshold voltage when the gate voltage is higher than a prescribed gate reference voltage while the semiconductor device is in an ON state, and sets the overcurrent detection threshold voltage to the first threshold voltage when the gate voltage is lower than the prescribed gate reference voltage during turn-on or turn-off of the semiconductor device.

6. The semiconductor device protection circuit according to claim 1, wherein during turn-on and turn-off of the semiconductor device, the timing adjustment circuit delays the timing at which the protection circuit begins operating by a prescribed period of time in order to prevent misdetection of overcurrent.

* * * * *